United States Patent
Lee et al.

(10) Patent No.: US 7,030,707 B2
(45) Date of Patent: Apr. 18, 2006

(54) OSCILLATOR CIRCUITS AND METHODS THAT CHANGE FREQUENCY IN INVERSE PROPORTION TO POWER SOURCE VOLTAGE

(75) Inventors: Byeong-hoon Lee, Seoul (KR);
Sun-kwon Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 61 days.

(21) Appl. No.: 10/859,622

(22) Filed: Jun. 3, 2004

(65) Prior Publication Data

US 2005/0007201 A1    Jan. 13, 2005

(30) Foreign Application Priority Data

Jul. 10, 2003    (KR) ...................... 10-2003-0046879

(51) Int. Cl.
*H03B 5/24*    (2006.01)
*H03K 3/027*    (2006.01)
*H03L 1/00*    (2006.01)

(52) U.S. Cl. ...................... 331/143; 331/111; 331/175; 331/177 R

(58) Field of Classification Search ................ 331/111, 331/143, 175–176, 177 R
See application file for complete search history.

(56) References Cited

U.S. PATENT DOCUMENTS

| 5,859,571 A | 1/1999 | Lee et al. |
| 5,864,258 A * | 1/1999 | Cusinato et al. ............... 331/34 |
| 5,969,557 A | 10/1999 | Tanzawa et al. |
| 6,201,434 B1 | 3/2001 | Kanda et al. |
| 6,295,217 B1 | 9/2001 | Yang et al. |

FOREIGN PATENT DOCUMENTS

| DE | 698 02 040 T2 | 7/2002 |
| EP | 0 881 765 B1 | 10/2001 |
| JP | 01231514 A | 9/1989 |

OTHER PUBLICATIONS

"Notification d'un Rapport de Recherche Preliminaire Avec Reponse Obligatoire" and "Rapport de Recherche Préliminaire" (Preliminary Search Report), French Application No. 04 07650, Aug. 3, 2005.

Tanzawa et al., "A Stable Programming Pulse Generator for High-Speed Programming Single Power Supply Voltage Flash Memories", *1995 Symposium on VLSI Circuits*, IEEE, Jun. 8, 1995, pp. 73-74.

* cited by examiner

*Primary Examiner*—David Mis
(74) *Attorney, Agent, or Firm*—Myers Bigel Sibley & Sajovec

(57) ABSTRACT

An oscillator includes a comparison voltage generating circuit, a comparing circuit and a clock switching circuit. The comparison voltage generating circuit is driven by a power source voltage, and generates comparison voltages that change in response to clock signals which have a frequency that varies in inverse proportion to the power source voltage and a first reference voltage. The comparing circuit compares levels of the comparison voltages to a second reference voltage and outputs logic signals having logic levels as a result of the comparison. The clock switching circuit outputs the clock signals which have a frequency that varies in inverse proportion to the power source voltage, in response to the logic signals.

14 Claims, 6 Drawing Sheets

OSCILLATOR CIRCUITS AND METHODS THAT CHANGE FREQUENCY IN INVERSE PROPORTION TO POWER SOURCE VOLTAGE

RELATED APPLICATION

This application claims the benefit of Korean Patent Application No. 2003-0046879, filed Jul. 10, 2003, the disclosure of which is hereby incorporated herein by reference in its entirety as if set forth fully herein.

FIELD OF THE INVENTION

The present invention relates to integrated circuits and operational methods thereof, and more particularly to oscillators and oscillation methods.

BACKGROUND OF THE INVENTION

Oscillators are used in various kinds of semiconductor devices. A semiconductor memory device will be used herein as an example of a semiconductor device that can use an oscillator. The semiconductor memory device may include a boost voltage generating circuit. The boost voltage generating circuit generates a boost voltage higher than an external power source voltage. The boost voltage generating circuit may be used for a word line driver, a bit line isolation circuit, and/or a data output buffer in the semiconductor memory device.

Moreover, a flash memory device may be used in portable digital devices such as a camcorder, a digital camera, a personal digital assistant (PDA), and/or an MPEG-1 layer 3 (MP3) player. A memory cell of the flash memory device may be programmed by hot electron injection and may be reset by Fowler-Nordheim (FN) tunneling occurring in an insulating layer between a source electrode of the memory cell and a floating gate of the memory cell. As such, the flash memory device may use a high voltage when programming and resetting. Thus, a flash memory device may also include a high voltage generating circuit.

A boost voltage generating circuit of a semiconductor memory device and/or a high voltage generating circuit of a flash memory device may generally include a pumping circuit and an oscillator. The pumping circuit may generate a boost voltage or a high voltage in response to a pulse control signal, and the oscillator generates a pulse control signal.

With the increasing demand for portable digital products capable of operating for a long time with a battery, attempts have been made to reduce power dissipation in portable digital products. One cause of power dissipation of portable digital products is the high voltage generating circuit of the flash memory device. Particularly, in the high voltage generating circuit, a change in a frequency of an output signal of an oscillator that controls the operation of the pumping circuit may have an influence upon the amount of current consumed by the portable digital device. Thus, it may be desirable to control the frequency of the output signal of the oscillator, so that the current consumed by the portable digital device may be reduced.

FIG. 1A illustrates a conventional ring oscillator and FIG. 1B is a detailed circuit diagram of an inverter of FIG. 1A.

Referring to FIG. 1A, a ring oscillator 10 includes a plurality, for example, first through fifth inverters 11–15 that are connected in series. A clock signal CLK_IN is input to the first inverter 11. A clock signal CLK_OUT output from the fifth inverter 15 is fed back to the first inverter 11. The clock signal CLK_OUT is delayed for a predetermined amount of time by each of the first through fifth inverters 11–15. Since the clock signal CLK_OUT output from the fifth inverter 15 is fed back to the first inverter 11, the ring oscillator 10 repeatedly outputs the clock signal CLK_OUT.

Each of the first through fifth inverters 11–15 may be implemented as a CMOS inverter. For example, referring to FIG. 1B, the first inverter 11 includes a PMOS transistor PM and an NMOS transistor NM. A source of the PMOS transistor PM is connected to a power source voltage VDD, and a drain of the PMOS transistor PM is connected to a drain of the NMOS transistor NM. A source of the NMOS transistor NM is connected to ground voltage VSS. An input signal IN is input to gates of the PMOS transistor PM and the NMOS transistor NM. An output signal OUT is output from the drains of the PMOS transistor PM and the NMOS transistor NM. The first inverter 11 delays the input signal IN for a predetermined amount of time and outputs the delayed signal as the output signal OUT.

As the power source voltage VDD decreases, the predetermined delay of the first inverter 11 increases. As a result, when the power source voltage VDD increases, the frequency of the clock signal CLK_OUT output from the ring oscillator 10 increases and when the power source voltage VDD decreases, the frequency of the clock signal CLK_OUT output from the ring oscillator 10 decreases.

FIG. 2 is a graph illustrating a relationship among a frequency of an output signal, current, and a power source voltage in a conventional oscillator included in a system. Referring to FIG. 2, graph A represents the frequency of the output signal of the oscillator with respect to the power source voltage, graph B represents current consumed by the system including the oscillator with respect to the power source voltage and the frequency of the output signal of the oscillator, and graph C represents current generated by a current generating block including the oscillator in the system with respect to the power source voltage and the frequency of the output signal of the oscillator. The current generating block may be, for example, the high voltage generating circuit of the flash memory device.

When the power source voltage increases from V1 to V2, it can be seen from graph A that the frequency of the output signal of the oscillator increases from F1 to F2. When the power source voltage increases from V1 to V2 and the frequency of the output signal of the oscillator increases from F1 to F2, it can be seen from graph B that current consumed increases from I3 to I4 and it can be seen from graph C that the current generated increases from I1 to I2. Here, I1 is the minimum amount of current for the operation of the whole system and I3 is the minimum amount of current consumed during the operation of the whole system. It can be seen from the curves of FIG. 2 that as the frequency of the output signal of the oscillator increases, the current generated and consumed by the system may also increase.

U.S. Pat. No. 6,295,217 to Yang et al., entitled "Low Power Dissipation Power Supply and Controller" describes a power supply that includes a voltage-controlled oscillator (VCO) that is responsive to rectified DC line voltage that provides for variable frequency operation in standby mode. The frequency output of the VCO is inversely proportional to the line voltage—as line voltage increases, the switching frequency decreases, which decreases the output power. See the Abstract of the Yang et al.

SUMMARY OF THE INVENTION

According to some embodiments of the present invention, an oscillator comprises a comparison voltage generating circuit, a comparing circuit and a clock switching circuit. The comparison voltage generating circuit is driven by a power source voltage and generates comparison voltages that change in response to clock signals which have a frequency that varies in inverse proportion to the power source voltage and a first reference voltage. The comparing circuit compares levels of the comparison voltages to a second reference voltage and outputs logic signals having logic levels as a result of the comparison. The clock switching circuit outputs the clock signals which have a frequency that varies in inverse proportion to the power source voltage, in response to the logic signals.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Each embodiment described and illustrated herein includes its complementary conductivity type embodiment as well. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
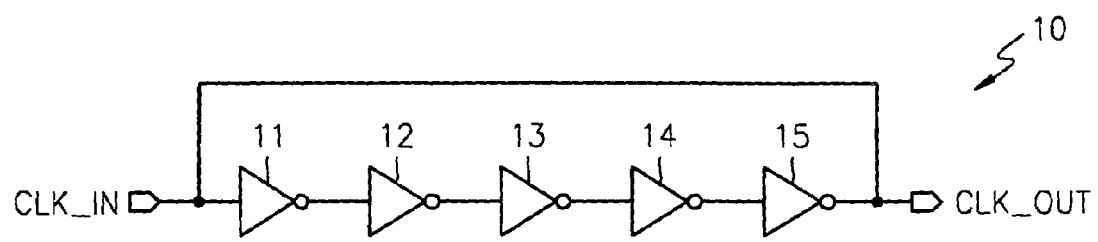
FIG. 1A illustrates a conventional ring oscillator.
Figure 1B:
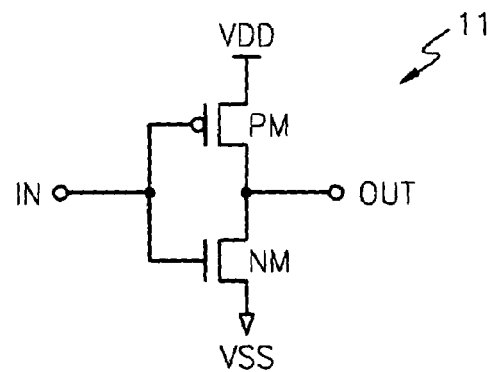
FIG. 1B is a detailed circuit diagram of an inverter in the conventional ring oscillator of FIG. 1.
Figure 2:
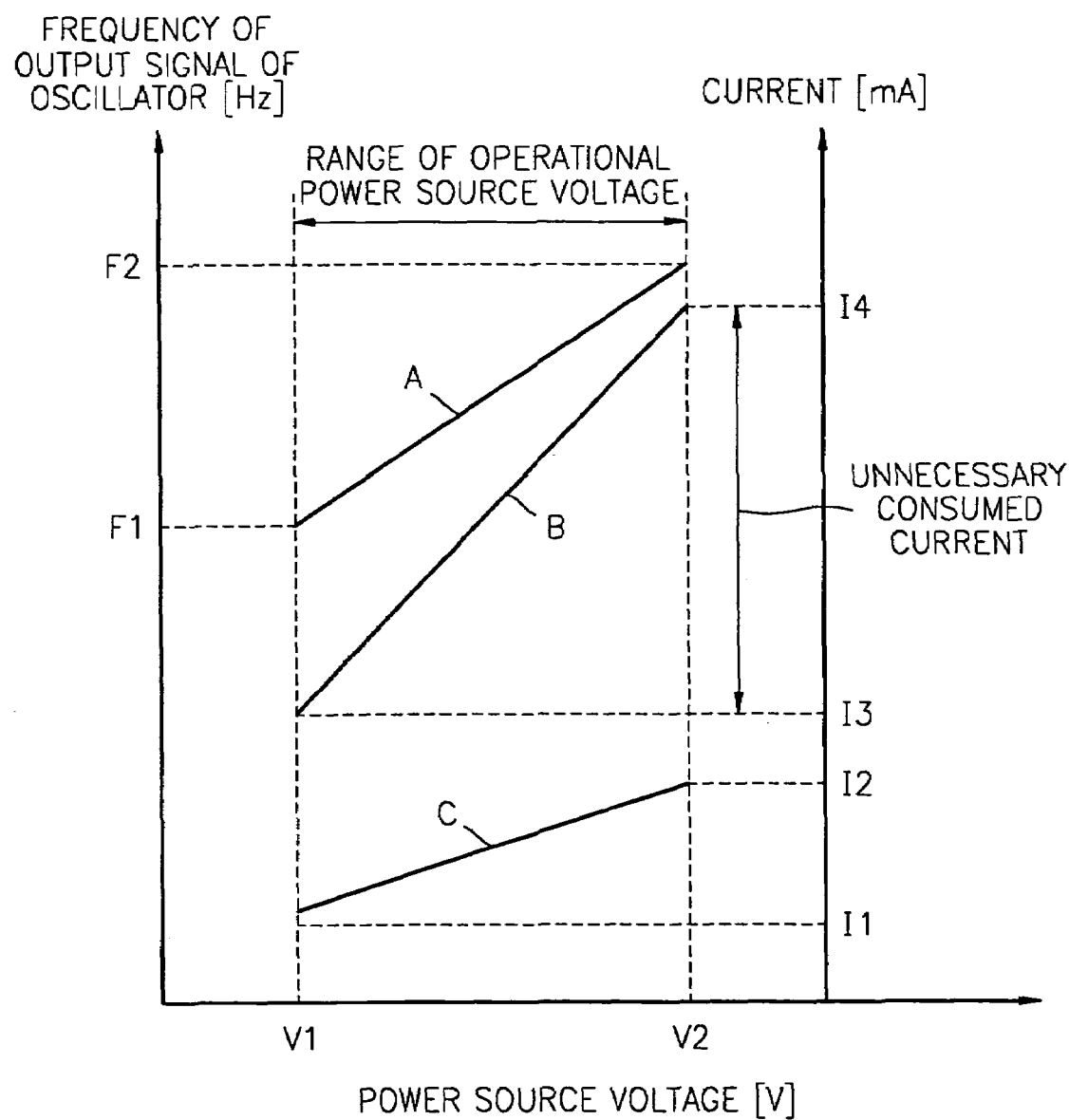
FIG. 2 is a graph illustrating the relationship among a frequency of an output signal, current, and a power source voltage in the conventional oscillator.
Figure 3:
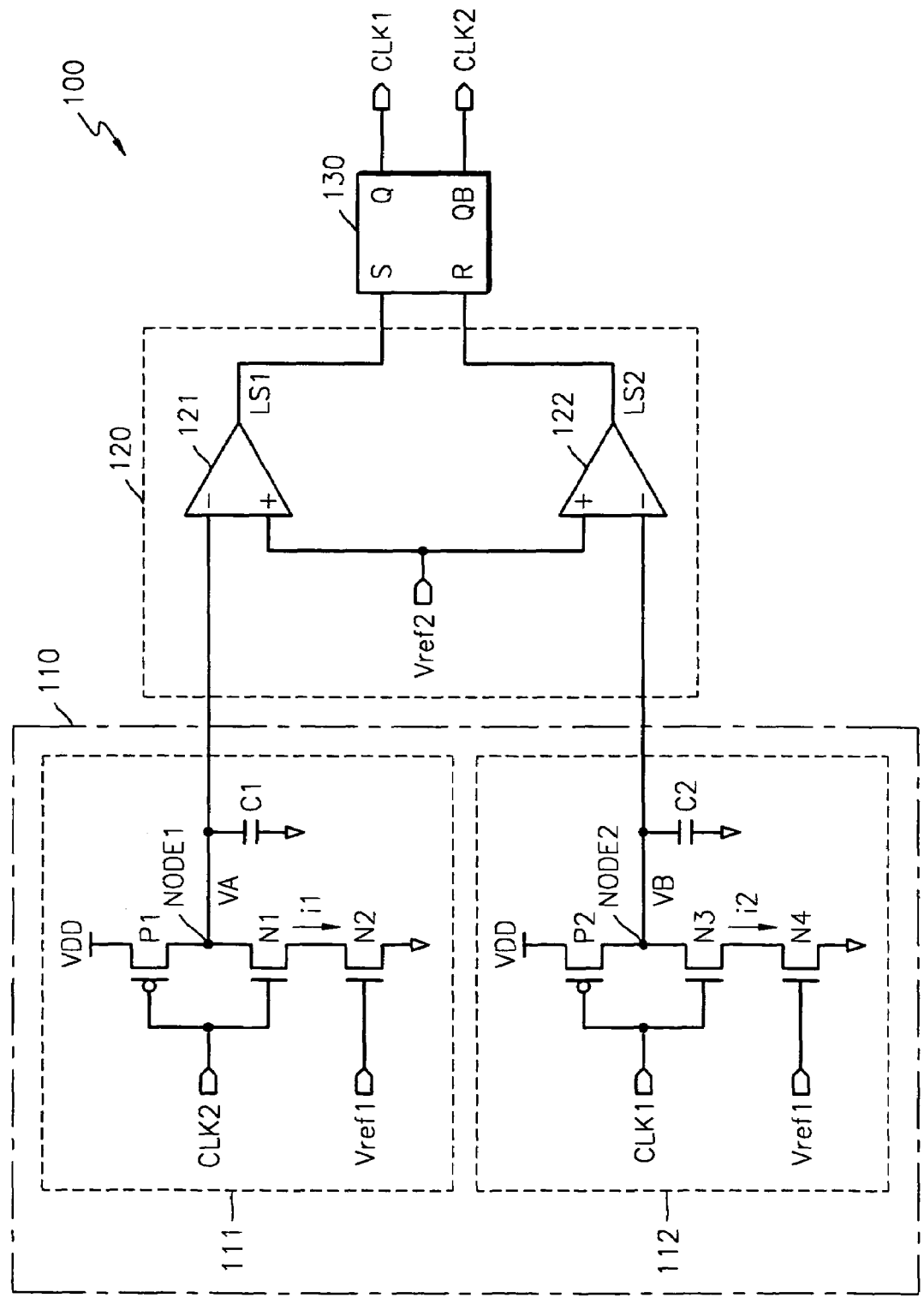
FIG. 3 illustrates an oscillator that changes frequency in inverse proportion to a power source voltage according to embodiments of the present invention.

FIG. 3 illustrates an oscillator that changes frequency in inverse proportion to a power source voltage according to embodiments of the present invention. Referring to FIG. 3, an oscillator 100 includes a comparison voltage generating circuit 110, a comparing circuit 120, and a clock switching circuit 130. The comparison voltage generating circuit 110 includes a first comparison voltage generating circuit 111 and a second comparison voltage generating circuit 112. The first comparison voltage generating circuit 111 generates a first comparison voltage VA in response to a second clock signal CLK2 and a first reference voltage Vref1. The second comparison voltage generating circuit 112 generates a second comparison voltage VB in response to a first clock signal CLK1 and the first reference voltage Vref1.

The first comparison voltage generating circuit 111 includes a PMOS transistor P1, NMOS transistors N1 and N2, and a capacitor C1. A source of the PMOS transistor P1 is connected to a power source voltage VDD, and a drain of the PMOS transistor P1 is connected to a first node NODE1. A drain of the NMOS transistor N1 is connected to the first node NODE1, and a source of the NMOS transistor N1 is connected to a drain of the NMOS transistor N2. The second clock signal CLK2 is input to gates of the PMOS transistor P1 and the NMOS transistor N1.

A source of the NMOS transistor N2 is connected to ground voltage, and a gate of the NMOS transistor N2 is connected to the first reference voltage Vref1. The capacitor C1 is connected between the first node NODE1 and ground voltage. The first comparison voltage VA is output from the first node NODE1.

The second comparison voltage generating circuit 112 includes a PMOS transistor P2, NMOS transistors N3 and N4, and a capacitor C2. A source of the PMOS transistor P2 is connected to the power source voltage VDD, and a drain of the PMOS transistor P2 is connected to a second node NODE2. A drain of the NMOS transistor N3 is connected to the second node NODE2, and a source of the NMOS transistor N3 is connected to a drain of the NMOS transistor N4. The first clock signal CLK1 is input to gates of the PMOS transistor P2 and the NMOS transistor N3.

A source of the NMOS transistor N4 is connected to ground voltage, and a gate of the NMOS transistor N4 is connected to the first reference voltage Vref1. The capacitor C2 is connected between the second node NODE2 and ground voltage. The second comparison voltage VB is output from the second node NODE2.

The comparing circuit 120 includes a first comparator 121 and a second comparator 122. The first comparator 121 compares the first comparison voltage VA to a second reference voltage Vref2 and outputs a first logic signal LS1. The second comparator 122 compares the second comparison voltage VB to the second reference voltage Vref2 and outputs a second logic signal LS2.

The first comparison voltage VA is input to a negative (−) input terminal of the first comparator 121, and the second reference voltage Vref2 is input to a positive (+) input terminal of the first comparator 121. Similarly, the second comparison voltage VA is input to a negative (−) input terminal of the second comparator 122, and the second reference voltage Vref2 is input to a positive (+) input terminal of the second comparator 122.

The clock switching circuit 130 may be implemented as an RS latch circuit. Hereinafter, the clock switching circuit 130 will be referred to as the RS latch circuit 130. The RS latch circuit 130 receives the first logic signal LS1 through its set terminal S and receives the second logic signal LS2 through its reset terminal R. The RS latch circuit 130 outputs the first clock signal CLK1 through a first output terminal Q and the second clock signal CLK2 through a second output terminal QB according to values of the first logic signal LS1 and the second logic signal LS2. The first clock signal CLK1 and the second clock signal CLK2 output from the RS latch circuit 130 are fed back to the second comparison voltage generating circuit 112 and the first comparison voltage generating circuit 111, respectively.

The first reference voltage Vref1 and the second reference voltage Vref2 can be different or identical.

Without wishing to be bound by any theory of operation, operation of the oscillator 100 will be described for the case when the first reference voltage Vref1 and the second reference voltage Vref2 are different.

First, the first comparison voltage generating circuit 111 outputs the first comparison voltage VA in response to the second clock signal CLK2 and the first reference voltage Vref1, and the second comparison voltage generating circuit 112 outputs the second comparison voltage VB in response to the first clock signal CLK1 and the first reference voltage Vref1.

More specifically, assume that in the initial state, the capacitor C2 is being charged, the second clock signal CLK2 is at a logic low level, and the first clock signal CLK1 is at a high logic level.

At this time, in the first comparison voltage generating circuit 111, the PMOS transistor P1 is turned on and the NMOS transistor N1 is turned off in response to the second clock signal CLK2. As a consequence, the capacitor C1 is charged to the power source voltage VDD via the PMOS transistor P1. As the capacitor C1 is charged, the first comparison voltage VA output from the first node NODE1 gradually increases.

Also, in the second comparison voltage generating circuit 112, the PMOS transistor P2 is turned off and the NMOS transistor N3 is turned on, in response to the first clock signal CLK1. As a result, the capacitor C2 is discharged to ground through the NMOS transistor N3 and the NMOS transistor N4. As the capacitor C2 is discharged, the second comparison voltage VB output from the second node NODE2 gradually decreases. The second comparison voltage VB decreases over time and is given by $$VB=VDD-\{(i2/C)\times t\} \qquad (1),$$

where i2 represents the current flowing when the capacitor C2 is discharged to ground through the NMOS transistor N3 and the NMOS transistor N4, C represents the amount of charge in the capacitor C2, and t represents time.

The NMOS transistor N2 of the first comparison voltage generating circuit 111 and the NMOS transistor N4 of the second comparison voltage generating circuit 112 produce currents i1 and i2, respectively, in response to the first reference voltage Vref1. Since the first reference voltage Vref1 is maintained at a specific level, the currents i1 and i2 are also maintained at specific levels, irrespective of a change in the power source voltage VDD.

Thereafter, the first comparator 121 of the comparing circuit 120 compares the first comparison voltage VA to the second reference voltage Vref2 and outputs the first logic signal LS1. The second comparator 122 of the comparing circuit 120 compares the second comparison voltage VB to the second reference voltage Vref2 and outputs the second logic signal LS2. Specifically, when the first comparison voltage VA is higher than the second reference voltage Vref2, the first comparator 121 outputs the first logic signal LS1 at a low level. Also, when the first comparison voltage VA is lower than the second reference voltage Vref2, the first comparator 121 outputs the first logic signal LS1 at a high level. The second comparator 122 operates similar to the first comparator 121, thus outputting the second logic signal LS2 at a high or low level.

Assume that the first comparison voltage VA is higher than the second reference voltage Vref2 and the second comparison voltage VB is lower than the second reference voltage Vref2. In this case, the first comparator 121 outputs the first logic signal LS1 at a low level and the second comparator 122 outputs the second logic signal LS2 at a high level.

Subsequently, the RS latch circuit 130 outputs the first clock signal CLK1 at a low level through the first output terminal Q and outputs the second clock signal CLK2 at a high level through the second output terminal QB in response to the first logic signal LS1 and the second logic signal LS2.

As the level of the second clock signal CLK2 transitions from the low to the high level, the PMOS transistor P1 of the first comparison voltage generating circuit 111 is turned off and the NMOS transistor N1 of the first comparison voltage generating circuit 111 is turned on. As a result, the capacitor C1 is discharged to ground through the NMOS transistors N1 and N2. As the capacitor C1 is discharged, the first comparison voltage VA output from the first node NODE1 gradually decreases. At this time, the first comparison voltage VA decreases over time at a similar rate to that given by Equation (1), i.e., the first voltage VA is given by VA=VDD−{(i1/C')×t}. Here, i1 represents current flowing when the capacitor C1 is discharged to the ground voltage through the NMOS transistor N1 and the NMOS transistor N2, C' represents the amount of charge in the capacitor C1, and t represents time.

As the first clock signal CLK1 transitions from the high to the low level, the PMOS transistor P2 of the second comparison voltage generating circuit 112 is turned on and the NMOS transistor N3 is turned off. As a result, the capacitor C2 is charged to the power source voltage VDD via the PMOS transistor P2. As the capacitor C2 is charged, the second comparison voltage VB gradually increases.

Since the first comparison voltage VA is lower than the second reference voltage Vref2, the first comparator 121 outputs the first logic signal LS1 at a high level. When the second comparison voltage VB is higher than the second reference voltage Vref2, the second comparator 122 outputs the second logic signal LS2 at a low level.

As a result, the RS latch circuit 130 outputs the first clock signal CLK1 at a high level through the first output terminal Q and outputs the second clock signal CLK2 at a low level through the second output terminal QB in response to the first logic signal LS1 and the second logic signal LS2.

By repetition of the above-described operation, the oscillator 100 outputs the first clock signal CLK1 that alternatively changes to the high level or low level and the second clock signal CLK2 that is in a state inverse to the first clock signal CLK1.

When the power source voltage VDD changes, changes in the frequency and current of the first clock signal CLK1 or the second clock signal CLK2 output from the oscillator 100 will be described with reference to FIGS. 4 and 5.

Figure 4:
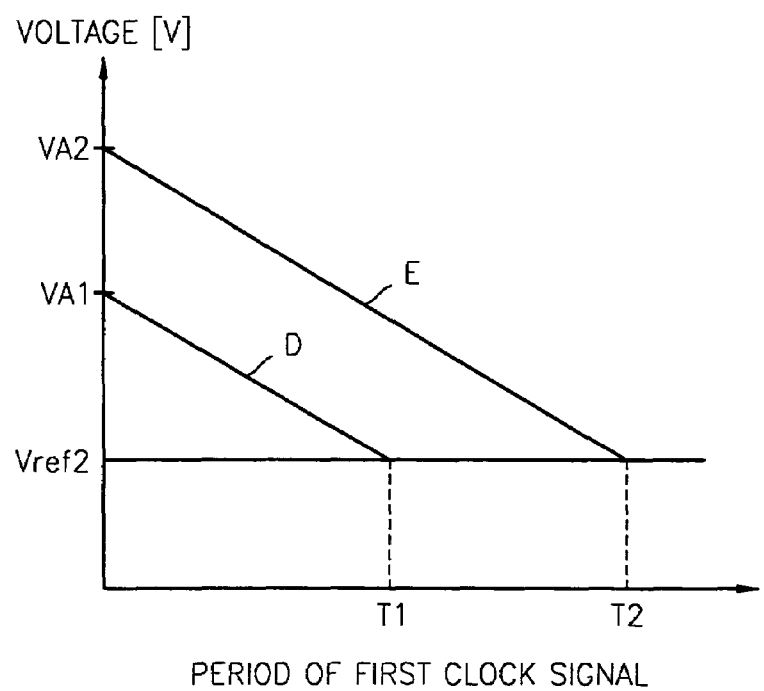
FIG. 4 is a graph illustrating a relationship between a first comparison voltage and a period of a first clock signal in an oscillator of FIG. 3.
Figure 5:
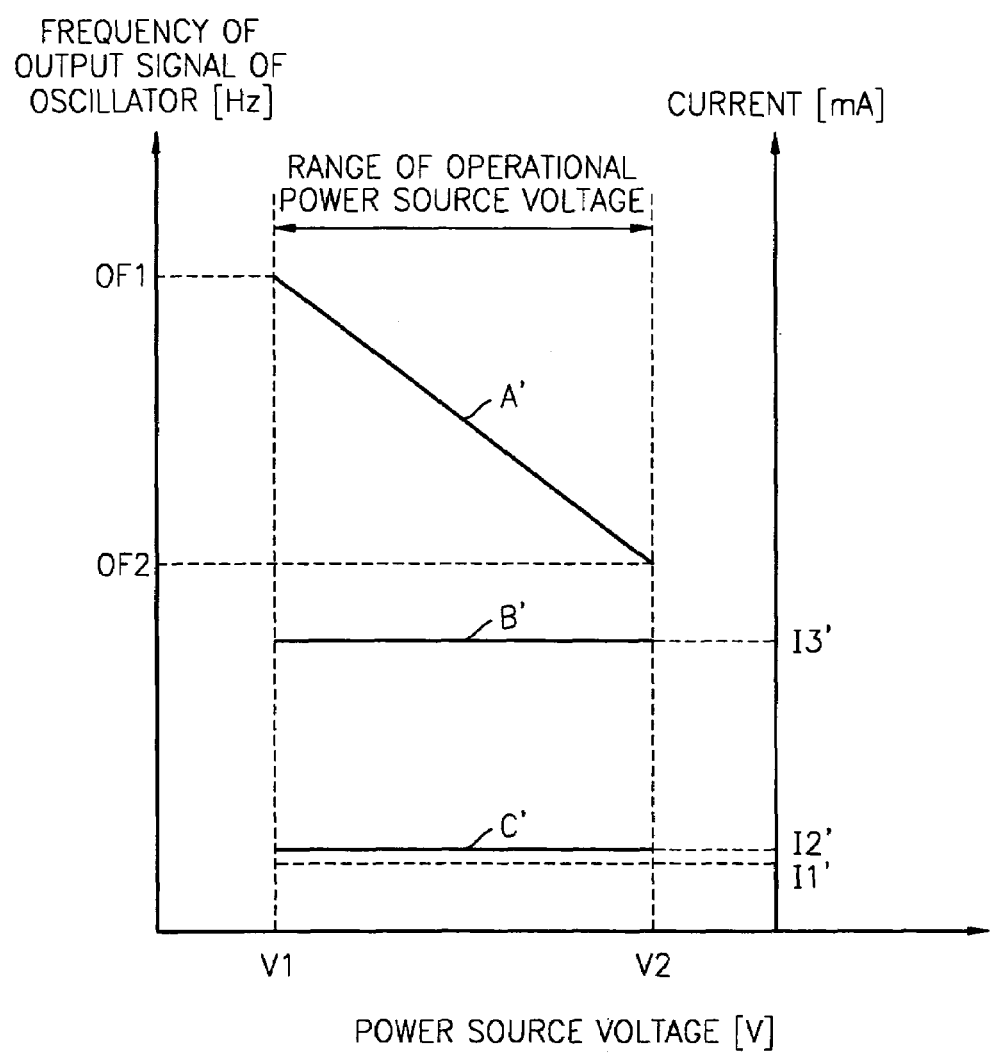
FIG. 5 is a graph illustrating a relationship among a frequency of an output signal, current, and a power source voltage in an oscillator of FIG. 3.

FIG. 4 is a graph illustrating a relationship between the first comparison voltage VA and the period of the first clock signal CLK1 in the oscillator 100, and FIG. 5 is a graph showing a relationship among the frequency of the output signal, current, and the power source voltage in the oscillator 100, according to some embodiments of the invention.

As the power source voltage VDD increases, the amount of charge in the capacitor C1 increases. Thus, the first comparison voltage VA output from the first node NODE1 increases. Referring to FIG. 4, when the first comparison voltage VA increases from VA1 to VA2, the period of the first clock signal CLK1 increases, resulting in a decrease in the frequency of the first clock signal CLK1.

Without wishing to be bound by any theory of operation, when the level of the first comparison voltage VA increases, the period of the first clock signal CLK1 may increase for the following reason: As the capacitor C1 is discharged, the first comparison voltage VA output from the first node NODE1 gradually decreases as shown in graphs D and E of FIG. 4. At this time, the first comparison voltage VA decreases at the ratio of (i2/C)×t, as given in Equation (1). The current i2 is maintained at a specific value by the first reference voltage Vref1, regardless of a change in the power source voltage VDD.

Thus, since the current i2 is constant even when the first comparison voltage VA increases from VA1 to VA2, graphs D and E have the same slope. As a result, as can be seen from FIG. 4, the period of the first clock signal CLK1 output from the oscillator 100 is larger when the first comparison voltage VA is VA2 than when the first comparison voltage VA is VA1. Finally, when the power source voltage VDD increases, the frequency of the first clock signal CLK1 output from the oscillator 100 decreases.

In FIG. 4, when the first comparison voltage VA is lower than the second reference voltage Vref2, the second clock signal CLK2 is inverted to the high or low level by the first comparator 121 and the RS latch circuit 130, and the capacitor C1 is charged or discharged according to the state of the second clock signal CLK2. Consequently, the period of the first clock signal CLK1 is the same as the time taken for the first comparison voltage VA to be at the same level as the second reference voltage Vref2.

Referring to FIG. 5, graph A' represents the frequency of the output signal of the oscillator (i.e., CLK1 or CLK2) with respect to the power source voltage, graph B' represents, current consumed by the system including the oscillator with respect to the power source voltage and the frequency of the output signal of the oscillator, and graph C' represents current generated by a current generating block including the oscillator of the system with respect to the power source voltage and the frequency of the output signal of the oscillator. Here, the current generating block may be, for example, a high voltage generating circuit of a flash memory device.

When the power source voltage increases from V1 to V2, it can be seen from graph A' that the frequency of the output signal of the oscillator decreases from OF1 to OF2. When the power source voltage increases from V1 to V2 and the frequency of the output signal of the oscillator decreases from OF1 to OF2 , it can be seen from graph B' that the current consumed is maintained at I3', and it can be seen from graph C' that the current generated is maintained at I2'.

Here, I2' is the minimum current used to operate the whole system and I3' is the minimum current consumed during the operation of the whole system. It can be seen from the graphs of FIG. 5 that as the power source voltage increases, the frequency of the output signal of the oscillator decreases. As a result, current consumed and current generated by the system may not increase, but may be held substantially constant.

Figure 6:
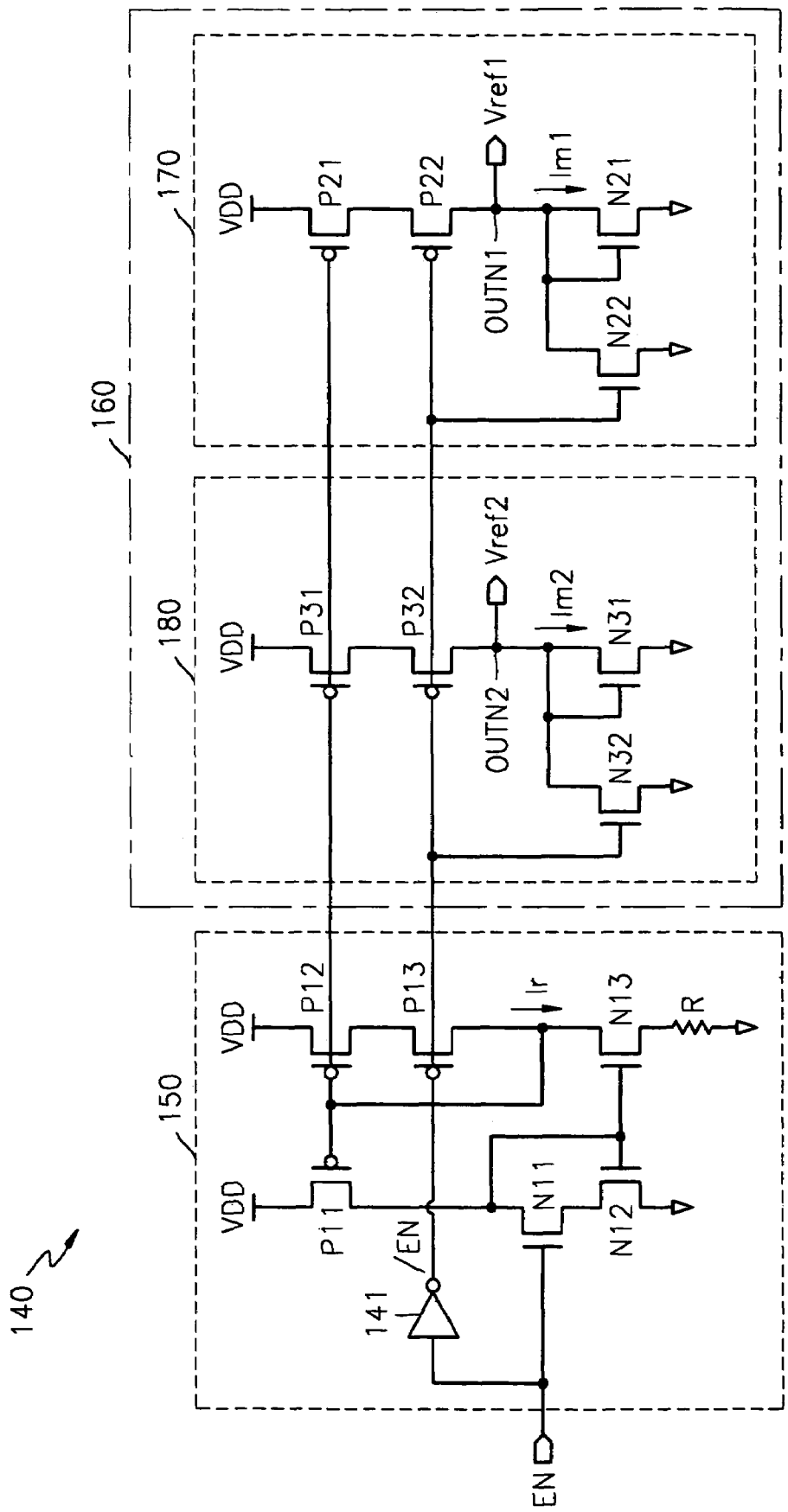
FIG. 6 illustrates a reference voltage generating circuit of an oscillator that changes frequency in inverse proportion to a power source voltage according to embodiments of the present invention.

FIG. 6 illustrates a reference voltage generating circuit for an oscillator that changes frequency in inverse proportion to a power source voltage according to embodiments of the present invention.

Referring to FIG. 6, a reference voltage generating circuit 140 includes a constant current generating circuit 150 and a current mirror circuit 160. The constant current generating circuit 150 generates a constant current Ir in response to a control signal EN. The constant current generating circuit 150 includes an inverter 141, PMOS transistors P11 through P13, NMOS transistors N11 through N13, and a resistor R. The inverter 141 inverts the control signal EN and outputs an inverted control signal /EN. Sources of the PMOS transistors P11 and P12 are connected to a power source voltage VDD, and gates of the PMOS transistors P11 and P12 are connected to a drain of the NMOS transistor N13. A source of the PMOS transistor P13 is connected to a drain of the PMOS transistor P12, and the inverted control signal /EN is input to a gate of the PMOS transistor P13.

A drain of the NMOS transistor N11 is connected to a drain of the PMOS transistor P11, and a source of the NMOS transistor N11 is connected to a drain of the NMOS transistor N12. The control signal EN is input to a gate of the NMOS transistor N11. A source of the NMOS transistor N12 is connected to ground. A drain of the NMOS transistor N13 is connected to a drain of the PMOS transistor P13, and a source of the NMOS transistor N13 is connected to ground through the resistor R. Gates of the NMOS transistors N12 and N13 are connected to a drain of the NMOS transistor N11.

The current mirror circuit 160 includes a first current mirror circuit 170 and a second mirror circuit 180. The first current mirror circuit 170 outputs a first reference voltage Vref1 in response to the inverted control signal /EN. The second current mirror circuit 180 outputs a second reference voltage Vref2 in response to the control signal EN.

The first current mirror circuit 170 includes PMOS transistors P21 and P22 and NMOS transistors N21 and N22. The second current mirror circuit 180 includes PMOS transistors P31 and P32 and NMOS transistors N31 and N32.

Sources of the PMOS transistors P21 and P31 are connected to the power source voltage VDD, and drains of the PMOS transistors P21 and P31 are connected to sources of the PMOS transistors P22 and P32, respectively. A gate of the PMOS transistor P21 is connected to a gate of the PMOS transistor P12. The gate of the PMOS transistor P31 is also connected to the gate of the PMOS transistor P12. The inverted control signal /EN is input to gates of the PMOS transistors P22 and P32. Drains of the PMOS transistors P22 and P32 are connected to a first output node OUTN1 and a second output node OUTN2, respectively.

Drains of the NMOS transistors N21, N22, N31, and N32 are connected to the first output node OUTN1 and the second output node OUTN2, respectively. Sources of the NMOS transistors N21, N22, N31, and N32 are connected to ground. The inverted control signal /EN is input to gates of the NMOS transistors N22 and N32.

Gates of the NMOS transistors N21 and N31 are connected to the first output node OUTN1 and the second output node OUTN2, respectively. The first reference voltage Vref1 is output from the first output node OUTN1, and the second reference voltage Vref2 is output from the second output node OUTN2.

Without wishing to be bound by any theory of operation, operation of the reference voltage generating circuit 140 will be described with reference to FIG. 6. When the control signal EN is activated at a high level, the inverter 141 inverts the control signal EN and outputs the inverted control signal /EN at a low level.

In the constant current generating circuit 150, the PMOS transistor P13 is turned on in response to the inverted control signal /EN and the NMOS transistor N11 is turned on in response to the control signal EN. When the NMOS transistor N11 is turned on, the NMOS transistors N12 and N13 are turned on. Then, the constant current generating circuit 150 generates the constant current Ir.

In the first current mirror circuit 170 and the second current mirror circuit 180, the PMOS transistors P22 and P32 are turned on and the NMOS transistors N22 and N32 are turned off in response to the inverted control signal /EN. When the PMOS transistors P22 and P32 are turned on, the NMOS transistors N21 and N31 are turned on. As a result, the first current mirror circuit 170 and the second current mirror circuit 180 generate reference currents Im1 and Im2, respectively, proportional to the constant current Ir and output the first reference voltage Vref1 and the second reference voltage Vref2, which are determined by the reference currents Im1 and Im2, to the first output node OUTN1 and the second output node OUTN2, respectively.

Here, the first reference voltage Vref1 and the second reference voltage Vref2 can vary with current-driving capabilities of the first current mirror circuit 170 and the second current mirror circuit 180.

Once the control signal EN is deactivated, the PMOS transistors P13, P22, and P32 and the NMOS transistors N11, N21, and N31 are turned off. Also, the NMOS transistors N22 and N32 are turned on, and thus, the first reference voltage Vref1 output from the first output node OUTN1 and the second reference voltage Vref2 output from the second output node OUTN2 are at ground voltage.

If levels of the first reference voltage Vref1 and the second reference voltage Vref2, input to the oscillator 100 of FIG. 3, are identical, the reference voltage generating circuit 140 may include only one current mirror circuit that generates a single reference voltage.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An oscillator comprising:
a comparison voltage generating circuit, which is driven by a power source voltage, and generates comparison voltages that change in response to clock signals which have a frequency that varies in inverse proportion to the power source voltage, and a first reference voltage;
a comparing circuit, which compares levels of the comparison voltages to a second reference voltage that is different from the first reference voltage and outputs logic signals having logic levels as a result of the comparison;
a clock switching circuit, which outputs the clock signals which have a frequency that varies in inverse proportion to the power source voltage, in response to the logic signals; and
a reference voltage generating circuit that generates the first reference voltage and the second reference voltage in response to a control signal, wherein the reference voltage generating circuit comprises:
a constant current generating circuit, which generates a constant current in response to the control signal;
a first current mirror circuit, which generates a first reference current proportional to the constant current in response to the control signal and outputs the first reference voltage, which is determined by the first reference current; and
a second current mirror circuit, which generates a second reference current proportional to the constant current in response to the control signal and outputs the second reference voltage, which is determined by the second reference current.

2. The oscillator of claim 1, wherein the comparison voltage generating circuit comprises:
a first comparison voltage generating circuit, which outputs a first comparison voltage of the comparison voltages in response to a second clock signal of the clock signals and the first reference voltage; and
a second comparison voltage generating circuit, which outputs a second comparison voltage of the comparison voltages in response to a first clock signal of the clock signals and the first reference voltage.

3. The oscillator of claim 2:
wherein the first comparison voltage generating circuit includes a first charging circuit that performs charging or discharging of a first capacitor according to a level of the second clock signal to change a level of the first comparison voltage;
wherein the second comparison voltage generating circuit includes a second charging circuit that performs charging or discharging of a second capacitor according to a level of the first clock signal to change a level of the second comparison voltage; and
wherein, when the first charging circuit performs charging, the second charging circuit performs discharging.

4. The oscillator of claim 3, wherein the comparing circuit comprises:
a first comparator, which compares the first comparison voltage to the second reference voltage and outputs a first logic signal of the logic signals; and
a second comparator, which compares the second comparison voltage to the second reference voltage and outputs a second logic signal of the logic signals.

5. The oscillator of claim 4:
wherein the first comparator outputs the first logic signal at a low level when the first comparison voltage is higher than the second reference voltage and outputs the first logic signal at a high level when the first comparison voltage is lower than the second reference voltage; and
wherein the second comparator outputs the second logic signal at a low level when the second comparison voltage is higher than the second reference voltage and outputs the second logic signal at a high level when the second comparison voltage is lower than the second reference voltage.

6. The oscillator of claim 5, wherein the clock switching circuit comprises an RS latch circuit, and the RS latch circuit outputs the first clock signal through a first output terminal in response to the first logic signal received through a first input terminal and outputs the second clock signal through a second output terminal in response to the second logic signal received through a second input terminal.

7. The oscillator of claim 1 in combination with a flash memory device, wherein a high voltage generating circuit of the flash memory device comprises the oscillator.

8. An oscillator comprising:
a comparison voltage generating circuit, which is driven by a power source voltage, and generates comparison voltages that change in response to clock signals which have a frequency that varies in inverse proportion to the power source voltage, and a first reference voltage;
a comparing circuit, which compares levels of the comparison voltages to a second reference voltage and outputs logic signals having logic levels as a result of the comparison;

a clock switching circuit, which outputs the clock signals which have a frequency that varies in inverse proportion to the power source voltage, in response to the logic signals;

wherein the level of the second reference voltage is identical to the level of the first reference voltage, to define a single reference voltage; and a reference voltage generating circuit that generates the single reference voltage in response to a control signal, wherein the reference voltage generating circuit comprises:

a constant current generating circuit, which generates a constant current in response to the control signal; and a current mirror circuit, which generates a reference current proportional to the constant current in response to the control signal and outputs the single reference voltage, which is determined by the reference current.

9. A method of generating an oscillating signal comprising:

generating comparison voltages that change in response to clock signals which have a frequency that varies in inverse proportion to a power source voltage and a first reference voltage;

comparing levels of the comparison voltages to a second reference voltage to provide logic signals having predetermined levels as a results of the comparison; and generating the clock signals which have a frequency that varies in inverse proportion to a power source voltage, in response to the logic signals;

wherein the level of the second reference voltage is identical to the level of the first reference voltage, to define a single reference voltage;

the method further comprising generating the single reference voltage in response to a control signal, wherein generating the single reference voltage in response to a control signal comprises:

generating a constant current in response to the control signal; and generating a reference current proportional to the constant current in response to the control signal, to provide the single reference voltage, which is determined by the reference current.

10. The method of claim 9, wherein generating comparison voltages comprises:

generating a first comparison voltage of the comparison voltages in response to a second clock signal of the clock signals and the single reference voltage; and generating a second comparison voltage of the comparison voltages in response to a first clock signal of the clock signals and the single reference voltage.

11. The method of claim 10:

wherein generating a first comparison voltage comprises charging or discharging a first capacitor according to a level of the second clock signal to change a level of the first comparison voltage; and wherein generating the second comparison voltage comprises charging or discharging a second capacitor according to a level of the first clock signal to change a level of the second comparison voltage.

12. The method of claim 11, wherein the comparing comprises:

comparing the first comparison voltage to the single reference voltage to provide a first logic signal of the logic signals; and comparing the second comparison voltage to the single reference voltage to provide a second logic signal of the logic signals.

13. The method of claim 12:

wherein comparing the first comparison voltage to the single reference voltage comprises providing the first logic signal at a low level when the first comparison voltage is higher than the single reference voltage and providing the first logic signal at a high level when the first comparison voltage is lower than the single reference voltage; and wherein comparing the second comparison voltage to the second reference voltage comprises providing the second logic signal at a low level when the second comparison voltage is higher than the single reference voltage and providing the second logic signal at a high level when the second comparison voltage is lower than the single reference voltage.

14. A method of generating an oscillating signal comprising:

generating comparison voltages that change in response to clock signals which have a frequency that varies in inverse proportion to a power source voltage and a first reference voltage;

comparing levels of the comparison voltages to a second reference voltage that is different from the first reference voltage, to provide logic signals having predetermined levels as a results of the comparison;

generating the clock signals which have a frequency that varies in inverse proportion to a power source voltage, in response to the logic signals; and generating the first reference voltage and the second reference voltage in response to a control signal, wherein generating the first reference voltage and the second reference voltage in response to a control signal comprises:

generating a constant current in response to the control signal;

generating a first reference current proportional to the constant current in response to the control signal to provide the first reference voltage, which is determined by the first reference current; and generating a second reference current proportional to the constant current in response to the control signal to provide the second reference voltage, which is determined by the second reference current.

* * * * *